United States Patent [19]

Radice

[11] 4,365,283

[45] Dec. 21, 1982

[54] CORONA DISCHARGE POLING PROCESS

[75] Inventor: Peter F. Radice, King of Prussia, Pa.

[73] Assignee: Pennwalt Corporation, Philadelphia, Pa.

[21] Appl. No.: 197,466

[22] Filed: Oct. 16, 1980

[51] Int. Cl.³ .............................................. H01F 1/02
[52] U.S. Cl. .................................... 361/233; 307/400
[58] Field of Search ....................... 361/233, 229, 225; 29/35.35; 307/400

[56] References Cited

U.S. PATENT DOCUMENTS

| | | | |
|---|---|---|---|
| 3,391,044 | 7/1968 | Kaghan et al. | 361/233 |
| 3,885,301 | 5/1975 | Murayama | 361/233 |
| 3,890,504 | 6/1975 | Pendleton et al. | 250/325 |
| 3,924,324 | 12/1975 | Kodera | 29/592 |
| 4,047,998 | 9/1977 | Yoshikawa et al. | 307/400 |
| 4,067,056 | 1/1978 | Taylor et al. | 361/233 |
| 4,079,437 | 3/1978 | Sheffield | 361/233 |
| 4,089,034 | 5/1978 | Taylor et al. | 361/233 |
| 4,172,905 | 10/1979 | Metcalfe et al. | 427/24 |

FOREIGN PATENT DOCUMENTS 1510833 5/1978 United Kingdom .
2020483 11/1978 United Kingdom .

OTHER PUBLICATIONS

"Corona Discharge Treatment Process and Apparatus", IBM Tech. Disclosure Bull., vol. 19, No. 5, Oct., 1976, p. 1644.

P. D. Southgate, "Room—temperature Poling and Morphology Changes in Pyroelectric Polyvinylidene Fluoride", Applied Physics Letters, vol. 28, No. 5, Mar. 1, 1976, pp. 250 to 252.

Primary Examiner—G. Z. Rubinson
Assistant Examiner—L. C. Schroeder

[57] ABSTRACT

The present invention provides a process for preparing piezoelectric film using a corona discharge device wherein a multi-layer of pellicles, of which at least one or more is a piezoelectric sensitive film and at least one other of the multi-layer is a companion pellicle (i.e. a pellicle with a conductance no less than that of the piezoelectric sensitive pellicle when the conductance is measured under the poling conditions of the corona discharge and in the direction of the discharge field), is subjected to a corona discharge between a pair of electrodes of which at least one such electrode has a textured surface.

18 Claims, 2 Drawing Figures

CORONA DISCHARGE POLING PROCESS

CROSS REFERENCE TO RELATED APPLICATIONS

Reference is hereby made to patent application of Peter F. Radice for "Apparatus for the Continuous Corona Poling of Polymeric Films" Ser. No. 197463 filed of even date herewith, and assigned to Pennwalt Corporation, assignee of the present invention.

BACKGROUND OF THE INVENTION

Films of dielectric materials have been observed to be capable of acquiring a static electric homo-charge upon being poled (i.e. being exposed to a field of high voltage or to a corona discharge), which static charge is quasi-permanent, the degree of permanency being dependent largely upon the chemical constitution of the film. Such a charge, due largely to trapped positive and negative carriers positioned at or near the two surfaces of the dielectric respectively, produces what is known as an electret. When the opposing surfaces of an electret are not covered by metal electrodes, an electret produces an electrostatic field and is in a sense the electrostatic analogue of the permanent magnet.

In addition to being capable of acquiring a static electric charge (and, as a result acquiring an electrostatic field) certain films also acquire an ordered internal molecular orientation when poled, known generally as polarization so that even when the static charges resulting from the trapped charges are dissipated, the film thereafter possesses electric charge-producing properties known as piezoelectric and pyroelectric effects (i.e. the property of producing electron flow between the electrically connected opposed surfaces, by changing the pressure imposed on the opposed surfaces or by changing the temperature of the film). Unfortunately, the term "electret" has been broadly used in the art to indicate any film that has been poled whether or not there has been molecular orientation. Such a broad application of the term is misleading. The confusion is compounded by the fact that piezo-and pyroelectric films are capable of acquiring static electric charges along with the internal molecular orientation they undergo during poling. The process of the present invention is directed to the production of piezoelectric and pyroelectric film and requires relatively rigid control of poling conditions and of the choice of film employed. The use of corona discharge to produce piezoelectric and pyroelectric film is known in the art. The use of the textured surface on at least one electrode in conjunction with the use of a backup pellicle during corona discharge is the crux of the present invention. The process permits the production of thin piezoelectric and pyroelectric film possessing relatively high piezoelectric and/or pyroelectric properties.

DEFINITIONS

Pellicle:

By the word "pellicle" is intended a thin sheet-like structure which may be a continuous film (such as produced from a plastic material on casting, extrusion or the like) or a non-woven structure such as paper or hot pressed synthetic fibers, and embraces as well glass, waxes, coatings and the like. These pellicles may take the form of a discrete segment or a continuous length of material.

Piezoelectric (or Pyroelectric) Sensitive Pellicle ("PES" pellicle):

A pellicle that is capable of acquiring a piezoelectric activity of at least about 5 pico-Coulombs per Newton (p C/N) when subjected to a corona discharge of between about 5 and about 15 kilovolts per mil thickness of said pellicle.

Companion Pellicle:

A pellicle that has a conductance no less than the conductance of the PES pellicle, when measured (a) under the poling conditions of the corona discharge and (b) in the direction of the discharge field. The companion pellicle may be identical to the PES pellicle.

Kynar ®7200:

A copolymer of approximately 70 weight percent vinylidene flouride and 30 weight percent tetrafluoroethylene.

Corona Discharge:

A phenomena occurring between charged plates, usually under high voltage, producing an electric discharge often visible, resulting from a partial electric breakdown in the gas surrounding the charged plates.

Textured Surface:

A surface characterized by multiple projections or indentations such as dimples, ripples, knurls, grooves, and ridges the protruding edges of which are generally sharp; the term is intended to embrace patterned as well as random configurations.

SUMMARY OF THE INVENTION

In accordance with the present invention, it has now been discovered that PES pellicles having excellent piezoelectric and/or pyroelectric properties are obtainable with a minimum of breakdown by subjecting a multi-layer of pellicles, of which at least one layer is a PES pellicle and at least one other layer of which is a companion pellicle, to a corona discharge between a pair of electrodes of which at least one such electrode has a textured surface. The process is operable on a continuous basis to efficiently and effectively produce poled PES pellicles on a commercial scale.

DESCRIPTION OF PREFERRED EMBODIMENTS

PES pellicle materials used in the present invention include vinylidene flouride polymers, vinylfluoride polymers, vinylchloride polymers, polyamides, and polyvinylidene cyanide. These may take the form of homopolymers, copolymers, or terpolymers, as well as polymer mixtures or blends. Preferred polymers are those containing at least a major mol proportion of vinylidene flouride including, for example, vinylidene flouride homopolymers, and copolymers or terpolymers containing at least 65 mol percent of vinylidene flouride and at least one other copolymerizable monomer such as tetrafluoroethylene and vinyl flouride. Excellent results are obtained for PES films comprising a copolymer of about 85 to 95 weight percent vinylidene fluoride and about 15 to 5 weight percent tetrafluoroethylene. Particularly good results are obtained for PES coatings using a copolymer of about 65 to 75 weight percent vinylidene fluoride and about 35 to 25 weight percent tetrafluoroethylene.

The PES pellicles may be monoaxially oriented or multiaxially oriented by conventional means such as blowing, stretching, rolling, and combinations of these techniques to enhance acquisition of their piezoelectric or pyroelectric properties upon polarization. However, non-oriented pellicles may also be poled, particularly in the form of a coating on a suitable substrate, which may even be the surface of one of the electrodes.

A PES pellicle thickness ranging from about 0.1 up to about 25 mils is suitable; thicknesses between 0.2 and 5 mils are preferred, however, since poled PES pellicles of this thickness are most often used in piezoelectric and pyroelectric devices and since thicker pellicles require the use of higher voltages during poling. The preferred polyvinylidene fluoride PES pellicles are particularly sensitive to breakdown when subjected to corona discharge, possibly due to the release of hydrogen fluoride.

The presence of a companion pellicle is essential in the process to protect the PES pellicle from breakdown during poling. It has been discovered that the presence of a companion pellicle in contact with the PES pellicle causes the voltage applied to the pellicle pair to be preferentially imposed across the PES pellicle, thereby imparting piezoelectric properties under conditions that otherwise would cause breakdown in the PES pellicle if used alone. While the inventor does not wish to be bound by any theory of operation, it is believed that this result occurs because a given voltage applied across such a multi-layer array is distributed according to the electrical conductance of each layer. The layer having the lowest conductance will have the highest voltage drop thereacross; thus the companion pellicle acts as a voltage divider. By way of illustration, when a voltage is applied across a two-layer array consisting of a PES pellicle of 1.0 mil polyvinylidene fluoride film having a measured resistance of $6.8 \times 10^9$ ohms and a companion pellicle of a 6.0 mil Kynar®7200 film having a measured resistance of $0.24 \times 10^9$ ohms, 97% of the voltage will be imposed across the 1.0 mil polyvinylidene fluoride film, since it constitutes 97% of the total resistance.

The companion pellicle material may be the same as the PES pellicle material and may also include, without limitation, thermosetting polymers, thermoplastic polymers, elastomers, plastics, glass, and paper. Virtually any imperforate non-conductor may be used for this purpose. However, it is recommended that polymers containing plasticizer be avoided because the results obtained may not be reproducible when the plasticized polymer is reused. The companion pellicle may be applied to either surface of the PES pellicle, but is preferably applied directly to the surface of the PES pellicle facing the electrode with the textured surface, since the pellicle facing the textured surface will be embossed thereby during operation. The substrate on which a PES pellicle coating is applied for polarization may be appropriately selected so as to serve as the companion pellicle. The thickness of the companion pellicle may be within the range described hereinabove for the PES pellicle, namely, from about 0.1 up to about 25 mils.

Ordinarily, the multi-layer array will comprise a PES pellicle and at least one companion pellicle provided between the PES pellicle and the electrode having the textured surface. However, the array may also be built up by the incorporation therein of additional layers of PES and companion pellicles. In this manner, two or more PES pellicles can be polarized simultaneously. While the PES pellicles and the companion pellicles are preferably arranged alternately in the multi-layer array, random arrangement of layers can also be employed. The multi-layer array can be regarded as a single thickness from the standpoint that only the two exterior layers are brought into contact with the electrode surfaces during application of the corona discharge.

Providing at least one of the corona-producing electrodes with a textured surface has been found to be essential to achieve a uniformly dispersed and tempered corona discharge which results in a significant reduction in breakdown of the PES pellicle during poling. The electrodes may be of various configurations. For example, both electrodes may be planar where no relative motion is to be provided, during application of the discharge field, between the electrodes and the multi-layer array. On the other hand, in the preferred embodiments wherein such relative motion is provided, it is desirable that one or both electrodes have a cylindrical configuration. For example, a cylindrical electrode having a knurled surface with about 10 to 60 knurls per inch has been found to produce excellent results.

The electrode having the textured surface may be negatively or positively charged, or it may be grounded.

The outer surfaces of the multi-layer array are preferably brought into actual physical contact with the surfaces of the electrodes during processing in order to ensure uniform charging and to avoid the need for additional equipment to maintain a constant spacing between the electrodes and the multi-layer array. However, the process can also be used without the occurrence of such contact.

In a variation of the process, the PES pellicle may have an electrically conductive layer deposited on one of its surfaces, which conductive layer can serve as one of the electrodes. The deposition of such a conductive layer can be accomplished by techniques well-know in the art, such as vapor deposition, electroplating, painting, sputtering, laminating, and the like. Electrically conductive materials suitable for this purpose include aluminum, zinc, gold, silver, tin, chrome, and nickel, as well as conductive oxides of these metals.

The voltage for producing the corona discharge will ordinarily be between about 5 and about 15 kilovolts per mil thickness of the PES pellicle.

In carrying out the polarization process, the multi-layer array is introduced between a pair of electrodes, at least one of which has a textured surface, and subjected to a corona discharge. Preferably, the electrode having the textured surface is passed back and forth or oscillated over the multi-layer array. This may be readily accomplished by employing at least one electrode having a cylindrical configuration which may be rolled over the array. As oscillation of the textured electrode continues, the piezoelectric properties imparted to the PES pellicle continue to increase to a maximum value characteristic of the particular PES pellicle being poled.

Ordinarily, the textured electrode will be rolled back and forth from about 5 to about 100 times over a given line of the multi-layer array, which line is perpendicular to the roll path of the textured electrode. Hence in the continuous mode of operation, the frequency of oscillation must be increased or decreased in accordance with the speed of the array passing between the electrodes. For very thick PES pellicles the number of oscillations may have to be increased above 100.

Although the poling process may be carried out over a wide temperature range, the preferred temperature lies between room temperature and just below the melt temperature of the PES pellicle. Preferably, the poled PES pellicle is heated after it has been subjected to the corona discharge. The subsequent heating step serves to continue polarization of the PES pellicle beyond the area where the corona discharge is applied.

The operation of the process of the present invention may be further understood by reference to the accompanying drawings, in which.

Figure 1:
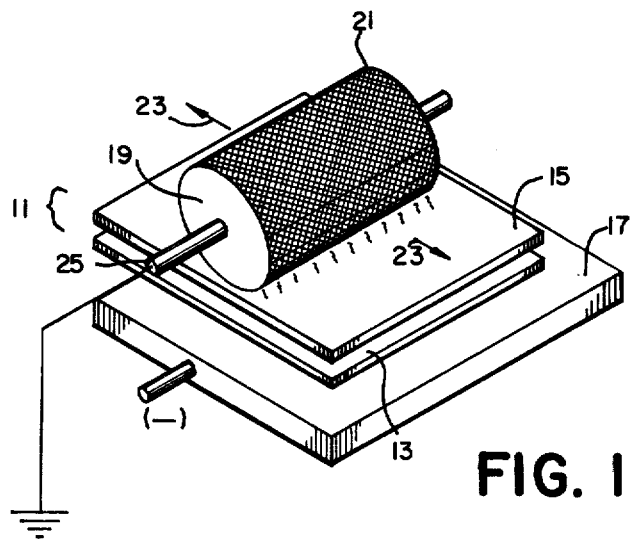
FIG. 1 is a perspective view of an apparatus designed for polarizing discrete segments of P.E.S. pellicles in accordance with the present invention.

Referring more specifically to the drawings, FIG. 1 shows the polarization of a multi-layered array of pellicles 11 composed of a PES pellicle to be polarized 13 and a companion pellicle 15. The array is positioned between planar electrode 17 which may be fabricated from any electrically conductive material, such as brass, and a cylindrical electrode 19 having a textured surface 21. Electrode 19 rests directly on array 11, making line contact therewith.

In the apparatus shown in FIG. 1, means are provided for passing textured electrode 19 back and forth over array 11 lengthwise along a path indicated by arrows 23. Thus, electrode 19 is capable of continuous oscillation over a given line of array 11, which line is perpendicular to the path of electrode 19. For example, electrode 19 may be mounted on axle 25 which provides handles for oscillating it manually with respect to array 11. Of course, the handles must be adequately insulated for operation in this manner. Alternatively, one or both ends of axle 25 may be connected to an actuator (not shown) such as a yoke, which may be mounted on a frame or the ceiling above the apparatus and connected to an oscillating motor for imparting oscillatory motion to electrode 19. In this embodiment, the textured electrode may be oscillated relative to the array, or vice versa. As shown in FIG. 1, the textured electrode should be somewhat narrower than the multi-layered array to prevent the possibility of arcing at the lateral edges thereof. For the same reason, oscillating electrode 19 must not come too close to the longitudinal edges of the array.

In carrying out the process, the electrodes are connected to a voltage source (not shown) which provides the voltage for producing a corona discharge therebetween. Electrode 19 is rolled back and forth over the array several times. Thereafter, the film may be heated in an oven (not shown) to complete the process.

Although a cylindrical electrode is illustrated as the textured electrode in FIG. 1, other electrode configurations such as a textured bar, may also be used. The cylindrical configuration is preferred, however, to facilitate contact with the array.

Figure 2:
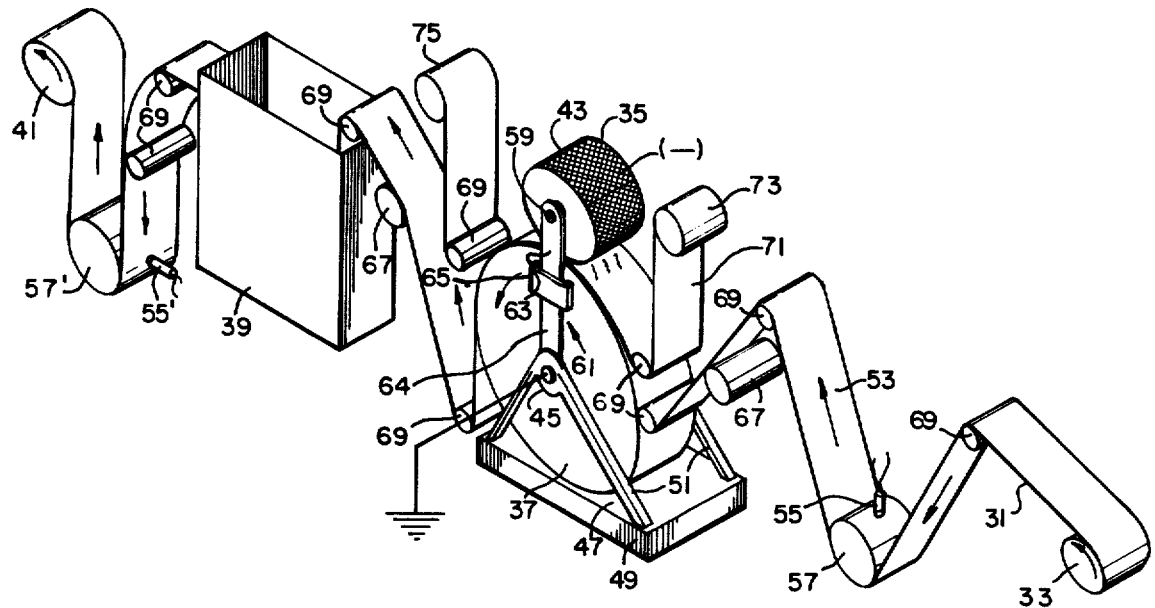
FIG. 2 is a perspective view of a presently preferred apparatus for carrying out the process of this invention in a continuous manner.

The apparatus for continuous operation shown in FIG. 2 includes a supply of PES pellicle 31, provided by supply reel 33, a pair of electrodes 35 and 37 for applying the corona discharge to the pellicle, heating means 39 for heating the pellicle after it has undergone the corona discharge, and means for gathering up the polarized product, such as take-up reel 41. Electrode 35 is provided with a textured surface 43. Companion pellicle 71 is pellicle 71 is illustrated as disposed between the PES pellicle and textured electrode 35 in the area of corona discharge; the back-up pellicle is supplied from reel 73 for concurrent passage with the PES pellicle between the electrodes. The back-up pellicle, after exposure to the corona discharge, is wound onto take-up reel 75.

In FIG. 2, electrode 37 provides means for continuously advancing PES pellicle 31 between electrodes 35 and 37. Thus in this particular embodiment, electrode 37, which is mounted on axle 45 journalled in a frame 47 comprising base 49 and electrode supporting members 51, serves as a transport roller for the array. Electrode/transport roller 37 rotates counterclockwise and continuously advances film or pellicle 31 in the direction of arrow 53. Rotary motion is imparted to electrode/transport roller 37 by means of a variable speed motor (not shown).

Supply reel 33 and take-up reel 41 are connected to separate motors (not shown) and operate in conjunction with electrode/transport roller 37 to advance the film during processing. The operation of the reel motors is controlled by proximity switches 55, 55' which are actuated in response to the movement of dancer rollers 57, 57'. Thus, if the film passing under dancer roller 57 allows the dancer roller to move a predetermined distance away from proximity switch 55, the operation of supply reel 33 will be temporarily interrupted. Similarly, if the film passing under dancer roller 57 causes dancer roller 57 to "dance" too close to proximity switch 55, the proximity switch will be activated and operation of supply reel 33 will resume. Passage of the film under dancer roller 57' produces the opposite effect on the operation of take-up reel 41, which is controlled by proximity switch 55'.

The rate of movement of the array of film may be controlled by appropriately adjusting the speed of the motor turning electrode/transport roller 37.

The apparatus of FIG. 2 is also provided with means for oscillating textured electrode 35 with respect to the film passing between it and electrode/transport roller 37 along the path of film travel. As shown in FIG. 2, textured electrode 35 is mounted upon axle 59, which is linked by telescoping connecting means 61 to frame 47. Telescoping connecting means 61 comprises a rod 63 which is joined to rotatable arm 64 by means of insulating sleeve 65. Rod 63 and arm 64 are each provided with a pair of insulated mounting posts for mounting a pair of springs thereon (not shown), externally of sleeve 65, which produce a slight downward pressure to be exerted by textured electrode 35 on the film as it passes between the electrodes. In this way, intimate contact is maintained between the textured electrode and the array. Connecting means 61 also serves to maintain the position of textured electrode 35 with respect to electrode/transport roller 37, preventing lateral displacement of the textured electrode from the path of the film, and permits oscillatory movement of textured electrode 35 relative to the film and electrode/transport roller 37. Oscillatory movement of textured electrode 35, which occurs in the direction of movement of the array between the electrodes, is provided by a programmable d.c. stepping motor in conjunction with a proximity switch (not shown) which controls the range of oscillatory movement.

As is customary in polymer film treating apparatus of this type, spreader rollers 67 are provided to prevent wrinkling of the film before and after contact with electrode/transport roller 37, and idler rollers 69 are provided to guide and alter the direction of movement of the film. The spreader rollers and idler rollers, as well as the supply and take-up reels, are preferably mounted on a suitable frame (not shown).

Supply reel 73 and take-up reel 75 for the companion pellicle may be provided with pulleys, each of which is connected by a belt to an idler roller, also provided with a pulley, to impart rotary motion to the reels. Alternatively, reels 73 and 75 may be connected to a single motor or to a pair of motors which will turn the reels at about the same speed.

The PES pellicle or film may be heated in heating chamber 39 after it has been exposed to the corona discharge in order to complete the polarization process.

Further details of the apparatus for carrying out the continuous corona discharge polarization process of this invention are set forth in my above-referenced copending application for "Rapid Continuous Corona Poling of Polymeric Films."

The following examples will serve to further illustrate this invention.

EXAMPLE 1

In this example, the apparatus used was similar to that shown in FIG. 1. The textured upper electrode was an aluminum cylinder 4.25 inches long, with a 3.5 inch outside diameter. The film-contacting surface of the upper electrode was knurled; the bottom electrode was a smooth surface, 0.25 inch thick brass plate.

The PES pellicle was a square of polyvinylidene fluoride film, 4.5 inches on a side and 1 mil thick, having on one side a 4 inch square nickel metallized area. The companion pellicle was a square of Kynar 7200 film, 7 inches on a side and 6 mils thick. The metallized side of the PES pellicle faced the bottom electrode. A voltage of 13,000 volts was applied across the electrodes, the bottom electrode being the "hot" electrode. The top electrode while emitting a corona discharge, was rolled back and forth over the companion pellicle of the two film layers forty-four times at room temperature. The PES pellicle was then heated in an oven at 85° C. for eleven minutes.

After removal from the oven and cooling, followed by pressure stabilization, the product was observed to generate 25 pC/N of piezoelectric activity as measured by an electrometer.

EXAMPLE 2

The techniques of Example 1 were followed, with the exception that a 30 mils thick aluminum plate was substituted for the brass plate as the bottom electrode. A Kynar ®7200 coating was applied to an aluminum panel as a PES pellicle and polarized using a 3.0 mil thick polyvinyl fluoride film as a companion pellicle. The top electrode was connected to the positive side of a d.c. power supply, and 8,000 volts were applied to the two-layer array and a corona discharge was observed. The top electrode was passed back and forth thirty times over the stack. The Kynar ®7200 coated plate was then heated in an oven for 10 minutes at 85° C.

The piezoelectric coefficient ($d_{33}$) of the coating on the aluminum plate was 8.6 pC/N, as measured by an electrometer.

Examples 3 and 4 describe continuous polarization of polymer films using apparatus as shown in FIG. 2. The upper electrode was an aluminum cylinder 4.5 inches long with an outside diameter of 4.5 inches. The exposed surfaces of the cylinder was knurled. The bottom electrode was a smooth surfaced aluminum cylinder, 12.25 inches long with an outside diameter of 13 inches.

EXAMPLE 3

A PES pellicle comprising a length of polyvinylidene fluoride film 31, having a thickness of aproximately 1.1 mil, was threaded through the apparatus from the supply reel 33 to the take-up reel 41 passing between the upper (textured sufaced) electrode 35 and lower electrode 37. Thereafter, as a companion pellicle, thirty feet of 6 mil Kynar ®7200 film 71 was threaded in place, as shown in FIG. 2. The voltage on the textured electrode 35 was 11,500 volts while the bottom electrode 37 was grounded. Electrode 35 oscillated through an arc around the top surface of electrodes 37 over a given line perpendicular to the line of travel of the two films approximately 70 times while the film was moving at the rate of 0.6 ft./min. The temperature in the heating chamber 39 was 75° C.

The piezoelectric activity of the polarized film after pressure stabilization was 15.0 pC/N, as measured by an electrometer.

EXAMPLE 4

The process of Example 3 was repeated except that the vicinity of electrode 35 was heated to 43° C., the applied voltage was 8,500 volts and the electrode 35 oscillated approximately 48 times while the film was moving at a rate of 1.0 ft./min.

After stabilizing overnight under pressure to remove static charge, the piezoelectric activity of the polarized film was measured at 22.0 pC/N.

The following two examples demonstrate the reduction in breakdown of polyvinylidene fluoride film resulting from the use of a textured electrode and a companion pellicle.

EXAMPLE 5

A 1 mil thick polyvinylidene fluoride homopolymer film as a PES pellicle was poled with a knurled cylindrical electrode using a technique and apparatus similar to that described in Example 1. Each PES pellicle was approximately two inches square having a one inch diameter metallized nickel coating on one surface thereof. A 6 mil thick Kynar ®7200 film was used as the companion pellicle against the unmetallized surface of the PES pellicle. The knurled electrode was passed back and forth 60 times over the companion pellicle, during which time a voltage of 9 kilovolts was applied across the electrodes. After heating in an oven at 85° C. for 10 minutes, followed by pressure stabilization, the piezoelectric activity of the PES pellicle was determined to be 21.6 pC/N. A virtually identical result was obtained using a grooved electrode instead of a knurled electrode. When the process was repeated using fresh films under the same conditions except that a smooth cylindrical aluminum electrode was substituted for the textured surfaced electrode, a spark passed through the film producing a hole in it after the film was introduced into the oven. It is believed that this indicates that the corona charge was not evenly distributed by the smooth electrode. The piezoelectric activity of the film, tested in an undamaged area was determined to be 20.0 pC/N.

EXAMPLE 6

A 1 mil thick PES pellicle of polyvinylidene fluoride together with a 6 mil thick companion pellicle of Kynar ®7200, was poled using the technique and apparatus of Example 1, except that the corona discharge was carried out at 45° C. with a voltage of 7000 kilovolts applied across the electrodes. The textured electrode was rolled back and forth across the companion pellicle of the two layers ninety times and the PES pellicle was subsequently heated at 75° C. for 20 minutes. The piezoelectric activity of the film product was determined to be 23.0 p C/N. When the same technique and equipment was employed, but without using a companion pellicle, breakthrough occurred during the first pass of the textured electrode over the PES pellicle.

On the average, it has been found that when using the continuous equipment of FIG. 2 to pole a PES pellicle of equivalent thickness without using a companion pellicle, there are several occurrences of breakthrough for about every fifteen feet of the film processed.

The final example shows the enhancement of piezoelectric activity of a polyvinylidene fluoride film as the textured electrode is repeatedly oscillated along the length of the muti-layer of pellicles during poling.

EXAMPLE 7

A multi-layer of a PES pellicle of polyvinylidene fluoride 0.4 mils thick, having one surface metallized with nickel, and a 6 mil thick Kynar ®7200 companion pellicle placed against the polymer face of the PES pellicle was poled using the technique and apparatus of Example 1 but employing 10,000 volts across the electrodes and passing the textured electrode four times over the two pellicle layers to produce the piezoelectric activity in the PES film of 13.0 p C/N. Using the same technique and equipment but increasing the number of passes of the textured electrode to forty-four was found to increase the piezoelectric activity of the PES film to 22.0 p C/N. In each case, the corona charged pellicle or film was subsequently heated at 85° C. for one minute.

From this example, it can be seen that repeated passing of the textured electrode over the stack will increase piezoelectric activity to the maximum capability of the material being poled.

From the foregoing description and examples, it will be appreciated that the use of a multilayer of PES and companion pellicles in conjunction with the textured corona-producing electrode, tempers the corona discharge of the air surrounding the multi-ply stack, thereby protecting the material to be polarized from breakdown. It will be further appreciated that the present invention provides a commercially useful process for making piezoelectric and/or pyroelectric pellicles in that it imparts high levels of piezoelectric or pyroelectric activity, in a relatively short time, and with a minimum of breakdown of the pellicle.

Those skilled in the art will appreciate that the procedures described in the foregoing examples are intended merely to illustrate and not to limit the invention, the practice of which is capable of wide variation and modification without departing from the scope and spirit of the invention as set forth in the appended claims.

I claim:

1. A process for poling polymer pellicles to impart piezoelectric activity to the pellicles comprising subjecting a multi-layer of pellicles of which at least one is a PES pellicle and at least one other of which is a companion pellicle to a corona discharge between a pair of electrodes of which at least one such electrode has a textured surface.

2. The process of claim 1 wherein said PES pellicle is composed of vinylidene fluoride homopolymer.

3. The process of claim 1 wherein said PES pellicle comprises at least 65 mol percent vinylidene fluoride and from 0 to 35 mol percent of at least one other copolymerizable monomer.

4. The process of claim 3 wherein said PES pellicle is in the form of a film which is composed of a copolymer of about 85 to 95 weight percent vinylidene fluoride and about 15 to 5 weight percent tetrafluoroethylene.

5. The process of claims 2, 3, or 4 wherein said PES pellicle is oriented in at least one direction.

6. The process of claim 1 wherein said PES pellicle has an electrically conductive layer deposited on one surface thereof.

7. The process of claim 1 wherein said PES pellicle is in the form of a coating on the corona discharge producing-portion of one of said electrodes.

8. The process of claim 7 wherein said coating is composed of a copolymer of about 65 to 75 weight percent vinylidene fluoride and about 35 to 25 weight percent tetrafluoroethylene.

9. The process of claim 1 wherein the companion pellicle is on a surface of the PES pellicle facing an electrode having a textured surface.

10. The process of claim 9 wherein the companion pellicle is the same as the PES pellicle.

11. The process of claim 9 wherein said companion pellicle is selected from the group consisting of thermosetting polymers, thermoplastic polymers, elastomers, plastics, glass or paper.

12. The process of claim 11 wherein said companion pellicle is composed of a copolymer of approximately 70 weight percent vinylidene fluoride and 30 weight percent tetrafluorethylene.

13. The process of claim 9 wherein at least one of said electrodes having said textured surface is passed back and forth in contact with said multi-layer of pellicles.

14. The process of claim 13 wherein said textured surface of said one electrode has a cylindrical configuration.

15. The process of claim 13 wherein said multi-layer of pellicles is heated to a temperature from about room temperature to about the melt temperature of said PES pellicle.

16. The process of claim 15 wherein said heating step is carried out after said multi-layer of pellicles has been subjected to said corona discharge.

17. The process of claim 13 wherein said corona discharge is produced at a voltage of about 5 to 15 kilovolts per mil thickness of said PES pellicle.

18. The process of claim 13 which includes continuously passing a length of said multi-layer of pellicles between said electrodes.

* * * * *